US012305927B2

(12) United States Patent
Huang

(10) Patent No.: US 12,305,927 B2
(45) Date of Patent: May 20, 2025

(54) INTEGRATED LIQUID COOLING HEAT DISSIPATION DEVICE

(71) Applicant: Tsung-Hsien Huang, I-Lan Hsien (TW)

(72) Inventor: Tsung-Hsien Huang, I-Lan Hsien (TW)

(*) Notice: Subject to any disclaimer, the term of this patent is extended or adjusted under 35 U.S.C. 154(b) by 174 days.

(21) Appl. No.: 18/236,855

(22) Filed: Aug. 22, 2023

(65) Prior Publication Data
US 2025/0035383 A1 Jan. 30, 2025

(30) Foreign Application Priority Data

Jul. 28, 2023 (TW) ................................. 112128302

(51) Int. Cl.
*F28F 1/12* (2006.01)
*F28D 1/053* (2006.01)
*F28F 13/12* (2006.01)
*H01L 23/473* (2006.01)
*F28D 1/02* (2006.01)
*H05K 7/20* (2006.01)

(52) U.S. Cl.
CPC .......... *F28D 1/05333* (2013.01); *F28F 1/126* (2013.01); *F28F 13/12* (2013.01); *F28D 2001/0286* (2013.01); *F28F 2250/08* (2013.01); *H01L 23/473* (2013.01); *H05K 7/20263* (2013.01); *H05K 7/20272* (2013.01)

(58) Field of Classification Search
CPC ............ H05K 7/20272; H05K 7/20263; H01L 23/473; F28D 1/05333; F28D 2001/0286; F28F 1/126; F28F 2250/08
See application file for complete search history.

(56) References Cited

U.S. PATENT DOCUMENTS

| 2020/0236807 | A1* | 7/2020 | Deng | F28F 27/02 |
| 2021/0015001 | A1* | 1/2021 | Xiao | H05K 7/20254 |
| 2021/0180890 | A1* | 6/2021 | Cheng | F28D 1/04 |
| 2021/0195797 | A1* | 6/2021 | Chen | H05K 7/20272 |
| 2021/0293491 | A1* | 9/2021 | Cai | F28D 21/00 |
| 2021/0360825 | A1* | 11/2021 | Wu | H05K 7/20272 |
| 2021/0385969 | A1* | 12/2021 | Geng | G06F 1/20 |
| 2022/0039290 | A1* | 2/2022 | Tsai | F04D 13/14 |
| 2022/0071058 | A1* | 3/2022 | Chen | F28D 15/046 |
| 2022/0291727 | A1* | 9/2022 | Tsai | G06F 1/20 |
| 2022/0307771 | A1* | 9/2022 | Huang | F28D 15/00 |
| 2022/0373275 | A1* | 11/2022 | Mostafavi Yazdi | F28F 9/0246 |

(Continued)

*Primary Examiner* — Paul Alvare
(74) *Attorney, Agent, or Firm* — Ying-Ting Chen; Law Office of Michael Chen

(57) ABSTRACT

An integrated liquid cooling heat dissipation device includes a liquid cooling radiator including first and second liquid boxes and a heat dissipation pipe set, a liquid cooling head and a liquid pump. The first liquid box forms an upper box body part and a lower box body part that is combined with the heat dissipation pipe set, so that the liquid collection space in the first liquid box is changed below the first liquid box, thereby reducing the height of the upper box body part. The upper box body part and the second liquid box protrude from the front and back of the heat dissipation pipe set, forming a fan installation space at the front and back of the liquid cooling radiator, so that the fan can simultaneously supply air to the heat dissipation pipe set and lower box body part to dissipate heat.

10 Claims, 11 Drawing Sheets

(56) References Cited

U.S. PATENT DOCUMENTS

| | | | | |
|---|---|---|---|---|
| 2022/0381516 A1* | 12/2022 | Huang | ................ | F28D 1/05391 |
| 2022/0400578 A1* | 12/2022 | Pan | .................... | H05K 7/20272 |
| 2023/0056832 A1* | 2/2023 | Tsai | ......................... | G06F 1/20 |
| 2024/0015927 A1* | 1/2024 | Xiao | .................. | H05K 7/20263 |

* cited by examiner

INTEGRATED LIQUID COOLING HEAT DISSIPATION DEVICE

BACKGROUND OF THE INVENTION

(a) Field of the Invention

The present invention relates to liquid cooling heat dissipation device technology and more particularly to a liquid cooling heat dissipation device that can reduce the height and increase the internal working fluid capacity of the liquid cooling radiator.

(b) Description of the Prior Art

The known liquid cooling heat dissipation devices used in computers and servers are usually separated liquid cooling heat dissipation device, which have separate liquid cooling radiators, liquid cooling heads, and liquid pumps, and are connected between each unit by a large number of liquid pipes. The liquid cooling radiator and the liquid cooling head of the separated liquid cooling heat dissipation device are set separately, the structure is not compact enough, the installation is inconvenient, and the cooling liquid flows slowly. For this reason, the inventor once proposed an integrated liquid cooling heat dissipation device (Taiwan Patent Publication No. 1765680) to solve the shortcomings of the conventional separated liquid cooling heat dissipation device.

However, when the integrated liquid cooling heat dissipation device is installed, the liquid cooling head at the bottom of the liquid cooling radiator must be attached to the surface of the processor chip, so that the liquid cooling radiator is set upright on the processor chip, so it is easy to cause the problem of insufficient space inside the computer case. For this reason, how to make the integrated liquid cooling heat dissipation device reduce its height and volume, and at the same time increase its internal working fluid capacity is the primary problem to be overcome by the present invention. Furthermore, the inside of the liquid collecting box at one end of the liquid cooling radiator of the conventional integrated liquid cooling heat dissipation device is divided into a cold liquid chamber and a hot liquid chamber. When the liquid flowing through the liquid cooling head absorbs heat and becomes hot liquid and flows to the hot liquid chamber, it will conduct heat through the metal partition to the cold liquid in the adjacent cold liquid chamber, causing the cold liquid that is going to flow into the liquid cooling head to be abnormally heated first, thus affecting the cooling effect after it flows into the liquid cooling head.

SUMMARY OF THE INVENTION

A main purpose of the present invention is to provide an integrated liquid cooling heat dissipation device, which comprises a liquid cooling radiator having a first liquid box, a second liquid box and a heat dissipation pipe set that combines the first liquid box and the second liquid box at both ends, a liquid cooling head set at the bottom of the second liquid box, and a liquid pump set in the first liquid box. The first liquid box forms an upper box body part and a lower box body part protruding downward from the lower end of the upper box body part. The lower end of the lower box body part is combined with the upper end of the heat dissipation pipe set, so that the liquid collection space in the first liquid box is changed below the first liquid box, thereby reducing the height of the upper box body part, making the integrated liquid cooling heat dissipation device easier to install inside the computer case.

Another object of the present invention is to provide a liquid cooling heat dissipation device, wherein the front and rear ends of the upper box body part and the second liquid box protrude from the front and back of the heat dissipation pipe set, which can increase the capacity of the working fluid and form a concave fan installation space at the front and back of the liquid cooling radiator, so that a fan can be installed in each fan installation space to supply air to the heat dissipation pipe set and lower box body part and to dissipate heat at the same time.

Still another object of the present invention is to provide a liquid cooling heat dissipation device, wherein the second liquid box of the liquid cooling radiator is separated into a cold liquid chamber and a hot liquid chamber through an air heat insulation space. Due to the low thermal conductivity of the air in the air heat insulation space, the hot working fluid in the hot liquid chamber cannot transfer heat to the cold working fluid in the cold liquid chamber.

DETAILED DESCRIPTION OF THE PREFERRED EMBODIMENTS

Figure 1:
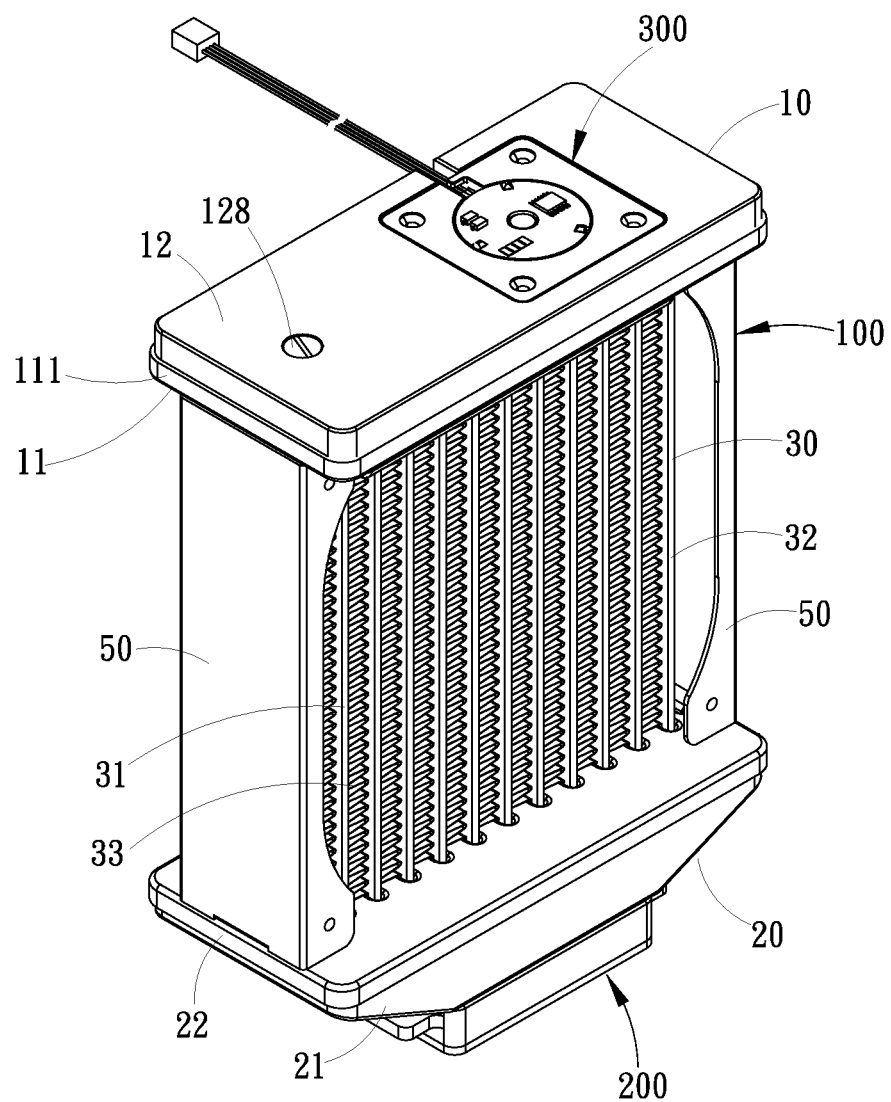
FIG. 1 is a three-dimensional schematic diagram of the integrated liquid cooling heat dissipation device of the present invention.
Figure 2:
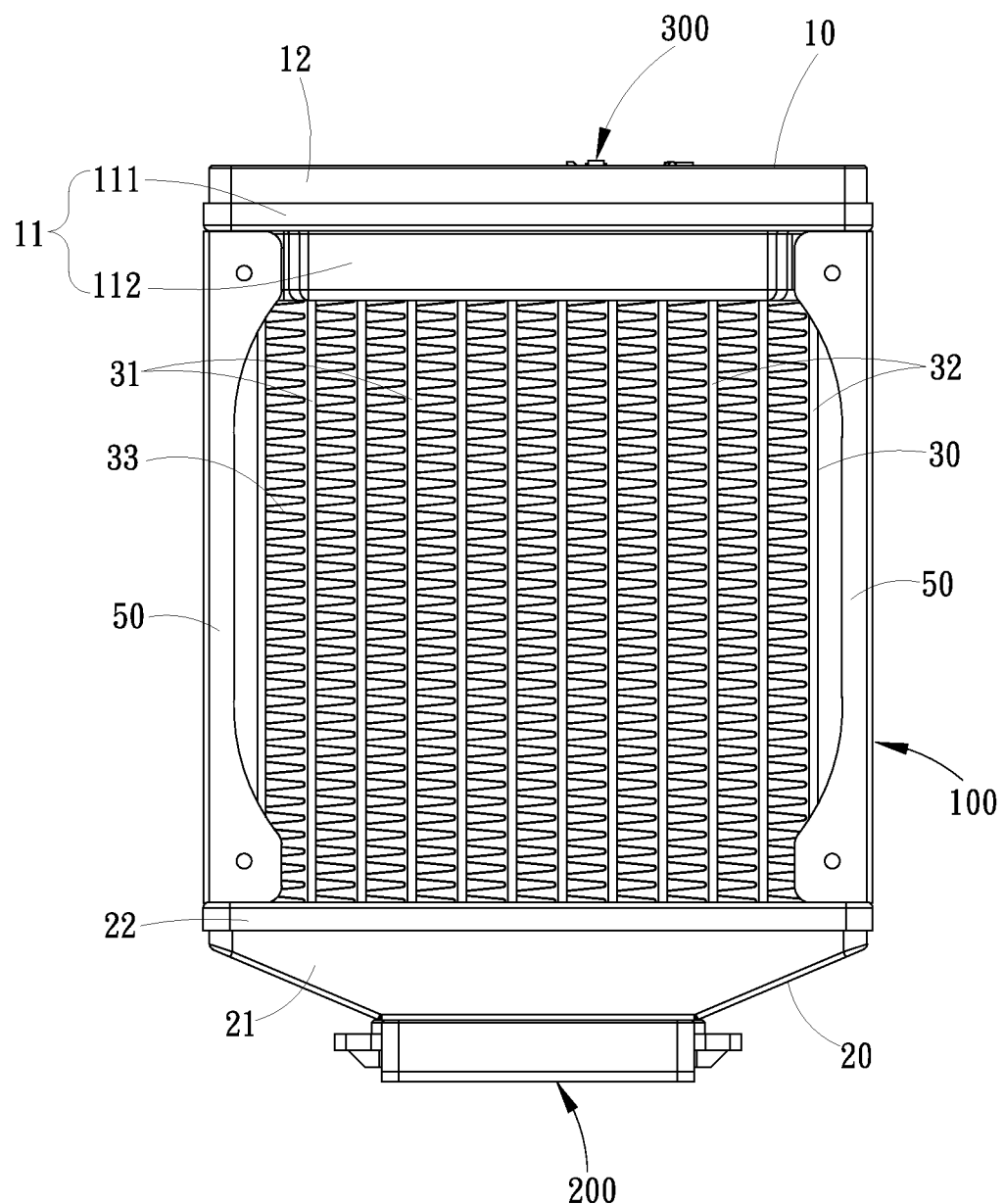
FIG. 2 is a schematic diagram of the front view of the integrated liquid cooling heat dissipation device of the present invention.

Referring to FIG. 1 and FIG. 2, the present invention is an integrated liquid cooling heat dissipation device, and its preferred embodiment comprises a liquid cooling radiator 100, a liquid cooling head 200 and a liquid pump 300. The liquid cooling radiator 100 comprises a first liquid box 10, a second liquid box 20 and a heat dissipation pipe set 30. The first liquid box 10 and the second liquid box 20 are boxes made of heat-dissipating metal (such as aluminum alloy), and are used to inject working fluid (water or other cooling fluids) into the first liquid box 10 and the second liquid box 20. The heat dissipation pipe set 30 comprises a plurality of first pipes 31 and a plurality of second pipes 32 arranged in parallel at intervals, and a plurality of cooling fins 33. The first pipes 31 and the second pipes 32 are flat metal pipes, the two ends of which are respectively combined and communicated with the first liquid box 10 and the second liquid box 20. The cooling fins 33 are arranged outside the first pipes 31 and the second pipes 32 respectively. One side of the liquid cooling head 200 is combined outside the bottom wall of the second liquid box 20, and the other side of the liquid cooling head 200 is used to attach to a processor chip (not shown). The liquid pump 300 is set in the first liquid box 10 to drive the working fluid in the liquid cooling radiator to circulate among the first liquid box 10, the first pipes 31, the second liquid box 20, the liquid cooling head 200, the second pipes 32, and the first liquid box 10 in sequence.

Figure 3:
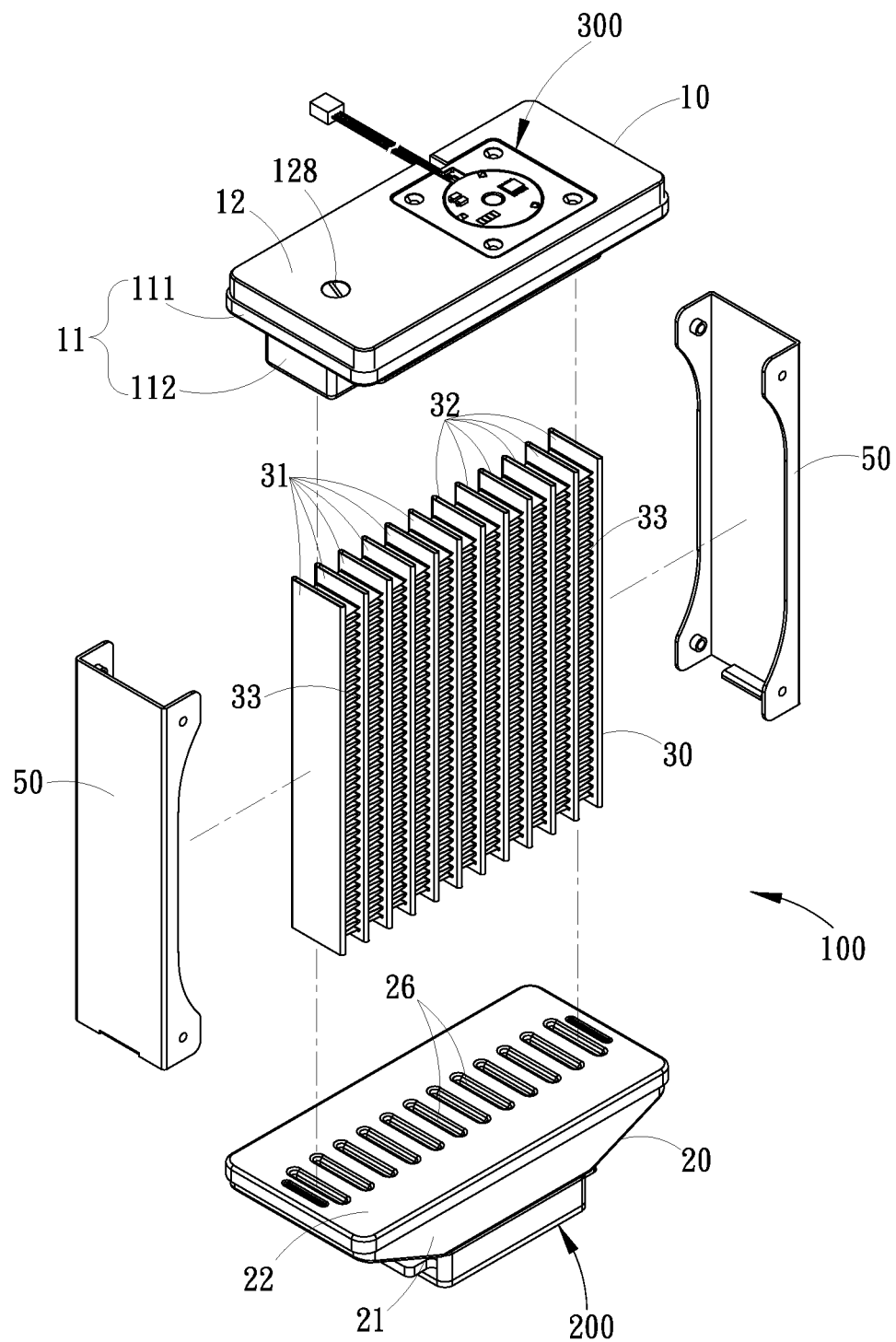
FIG. 3 is an exploded schematic diagram of the integrated liquid cooling heat dissipation device of the present invention.
Figure 4:
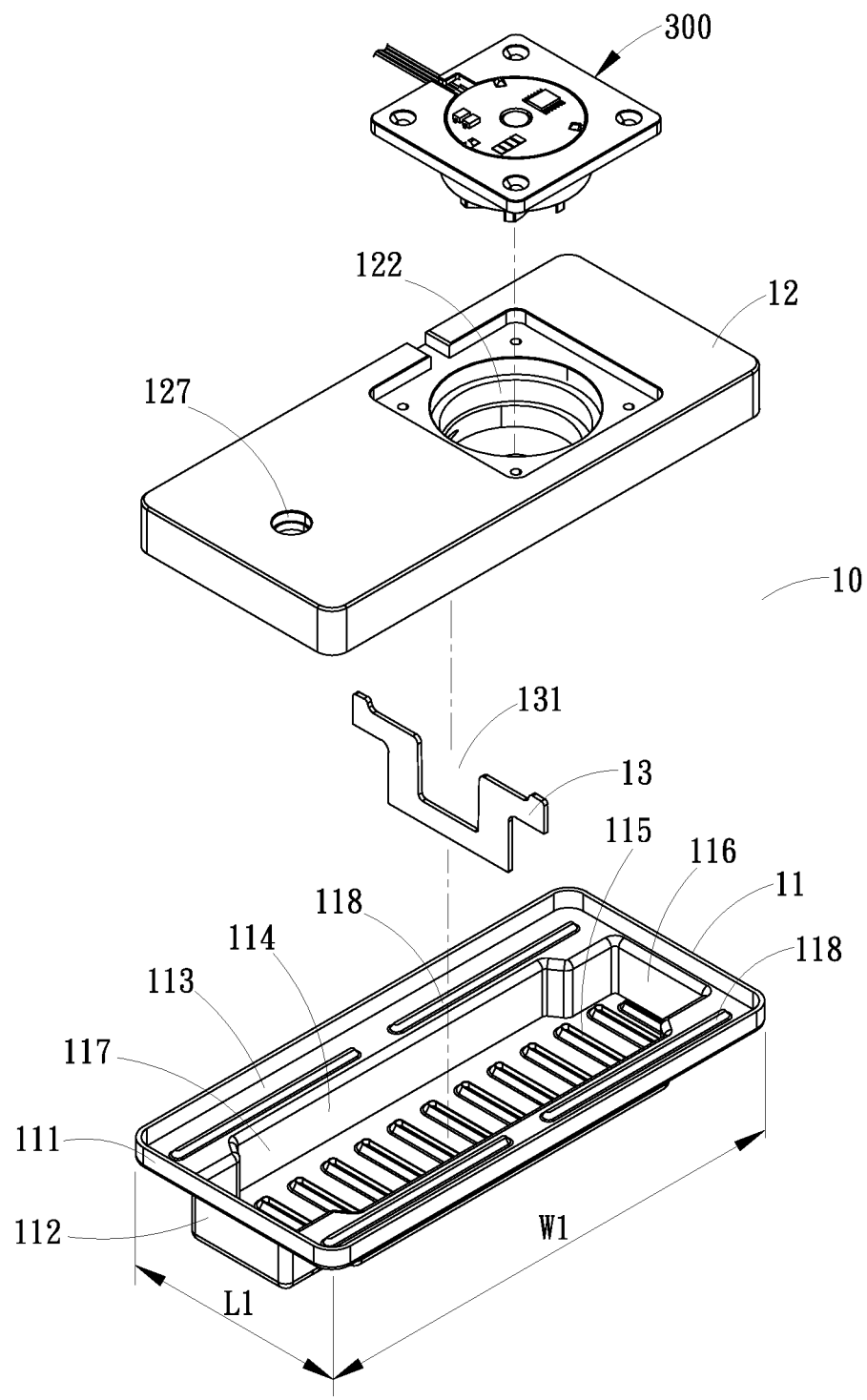
FIG. 4 is an exploded schematic diagram of the first liquid box and heat dissipation pipe set of the present invention.
Figure 5:
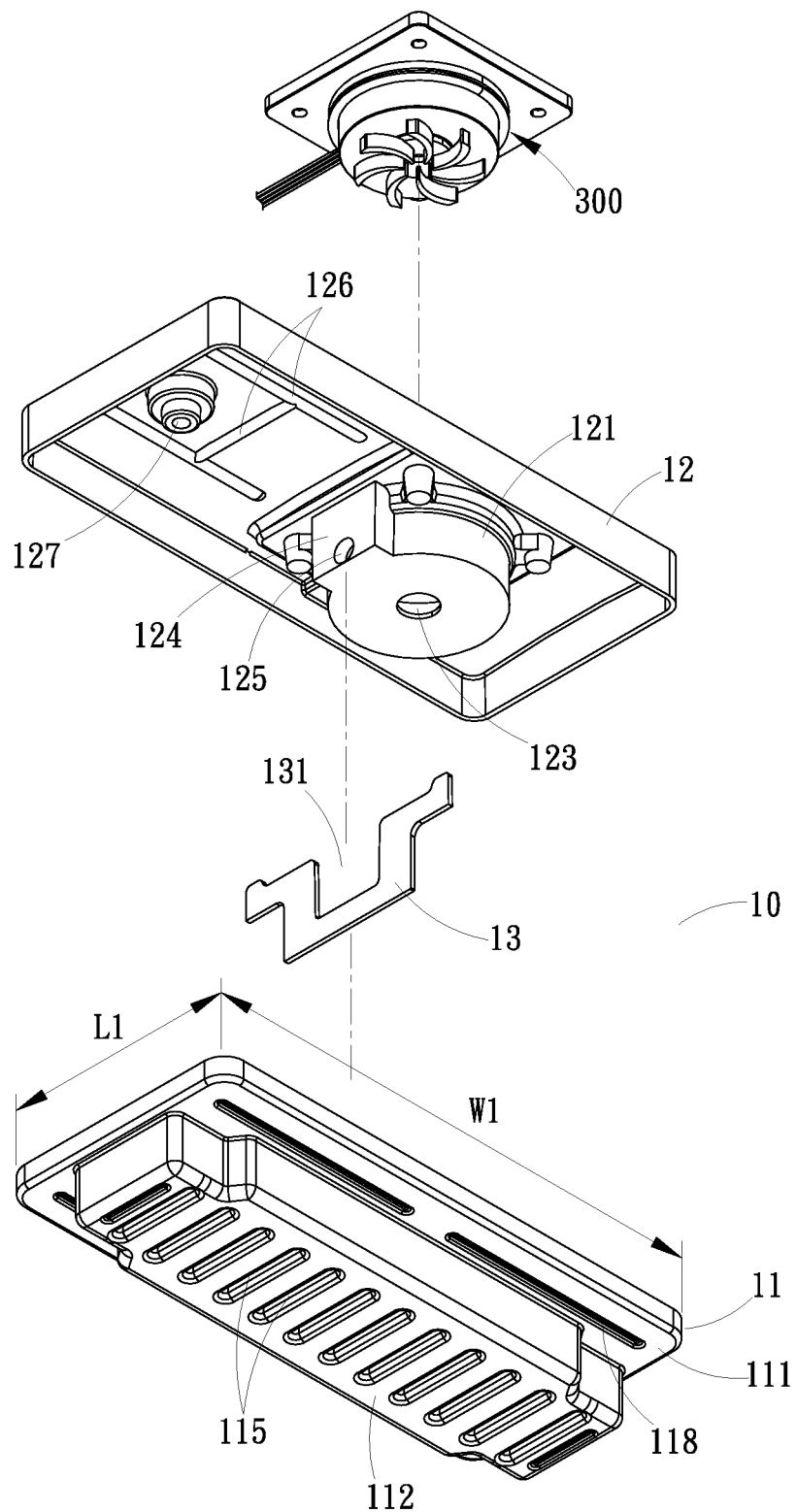
FIG. 5 is an exploded schematic diagram of the first liquid box of the present invention.
Figure 8:
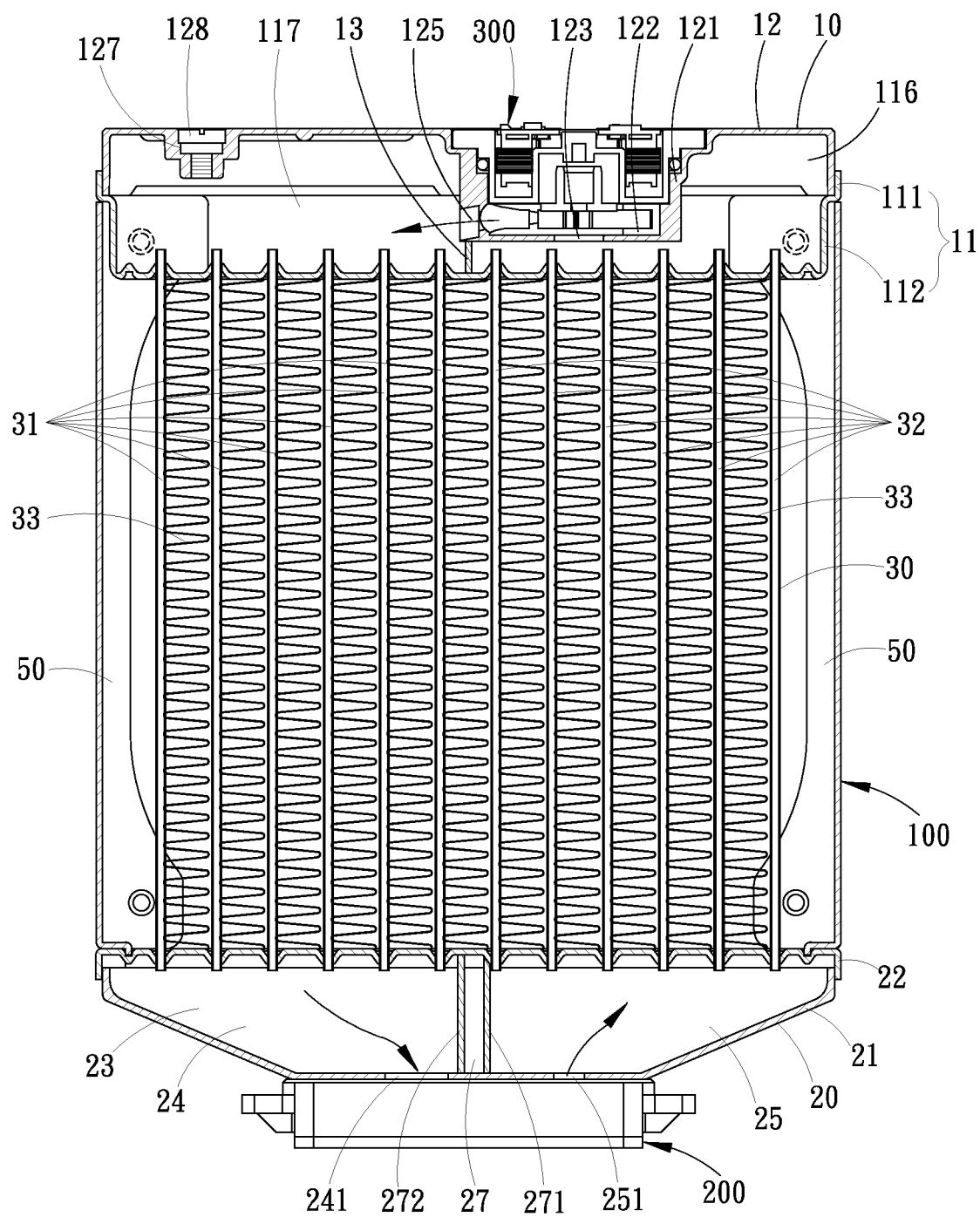
FIG. 8 is a schematic diagram of the front view of the integrated liquid cooling heat dissipation device of the present invention.
Figure 9:
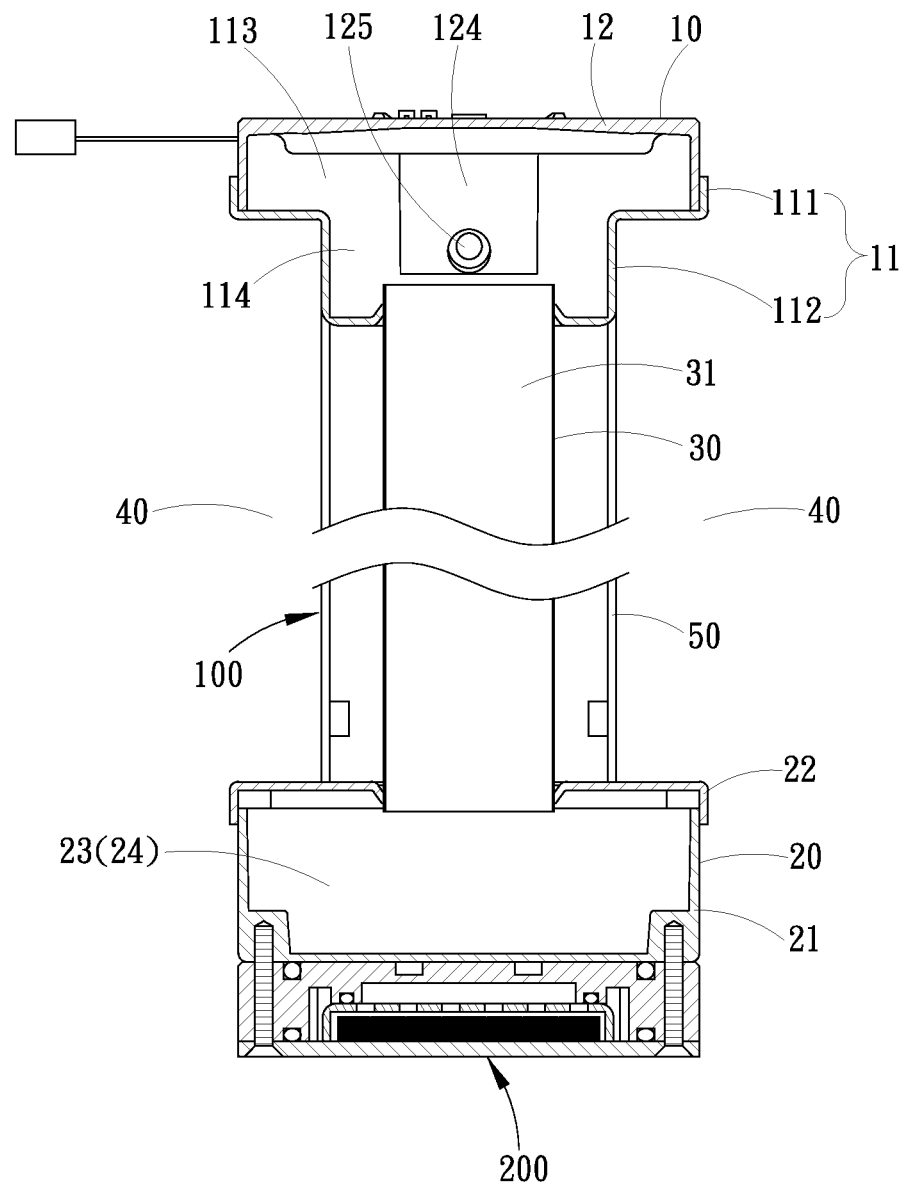
FIG. 9 is a schematic cross-sectional side view of the integrated liquid cooling heat dissipation device of the present invention.

Referring to FIG. 3, FIG. 4 and FIG. 5, the first liquid box 10 above the liquid cooling radiator 100 is preferably implemented with a first box body 11, a first box cover 12 and a first partition 13. The first box body 11 is integrally formed into a rectangular upper box body part 111 and a lower box body part 112. The upper box body part 111 has a thickness L1 and a width W1 greater than that of the lower box body part 112. The upper end of the upper box body part 111 is recessed to form a first upper chamber 113. The lower box body part 112 protrudes downward from the lower end of the upper box body part 111, so that the upper box body part 111 and the lower box body part 112 of the first box body 11 form a T-shaped box body in side view (as shown in FIG. 9). At the same time, the bottom surface of the first upper chamber 113 forms a first lower chamber 114 recessed into the lower box body part, so that the first upper chamber 113 and the first lower chamber 114 form a T-shaped chamber inside view (as shown in FIG. 9). The bottom wall of the lower box body part 112 is provided with a plurality of first pipe jacks 115 connected to the first lower chamber 114, so that the upper ends of the first pipes 31 and the second pipes 32 of the heat dissipation pipe set 30 are inserted into the first pipe jacks 115 respectively (as shown in FIG. 8). The first box cover 12 covers the upper end of the upper box body part 111 to close the first upper chamber 113. The first partition 13 is arranged transversely in the first upper chamber 113 and the first lower chamber 114 to divide the first upper chamber 113 and the first lower chamber 114 into a liquid inlet chamber 116 and a liquid outlet chamber 117, so that the upper ends of the first pipes 31 are connected to the liquid outlet chamber 117, and the upper ends of the second pipes 32 are connected to the liquid inlet chamber 116. The above-mentioned liquid pump 300 is combined in the first box cover 12 and located in the liquid inlet chamber 116.

Figure 6:
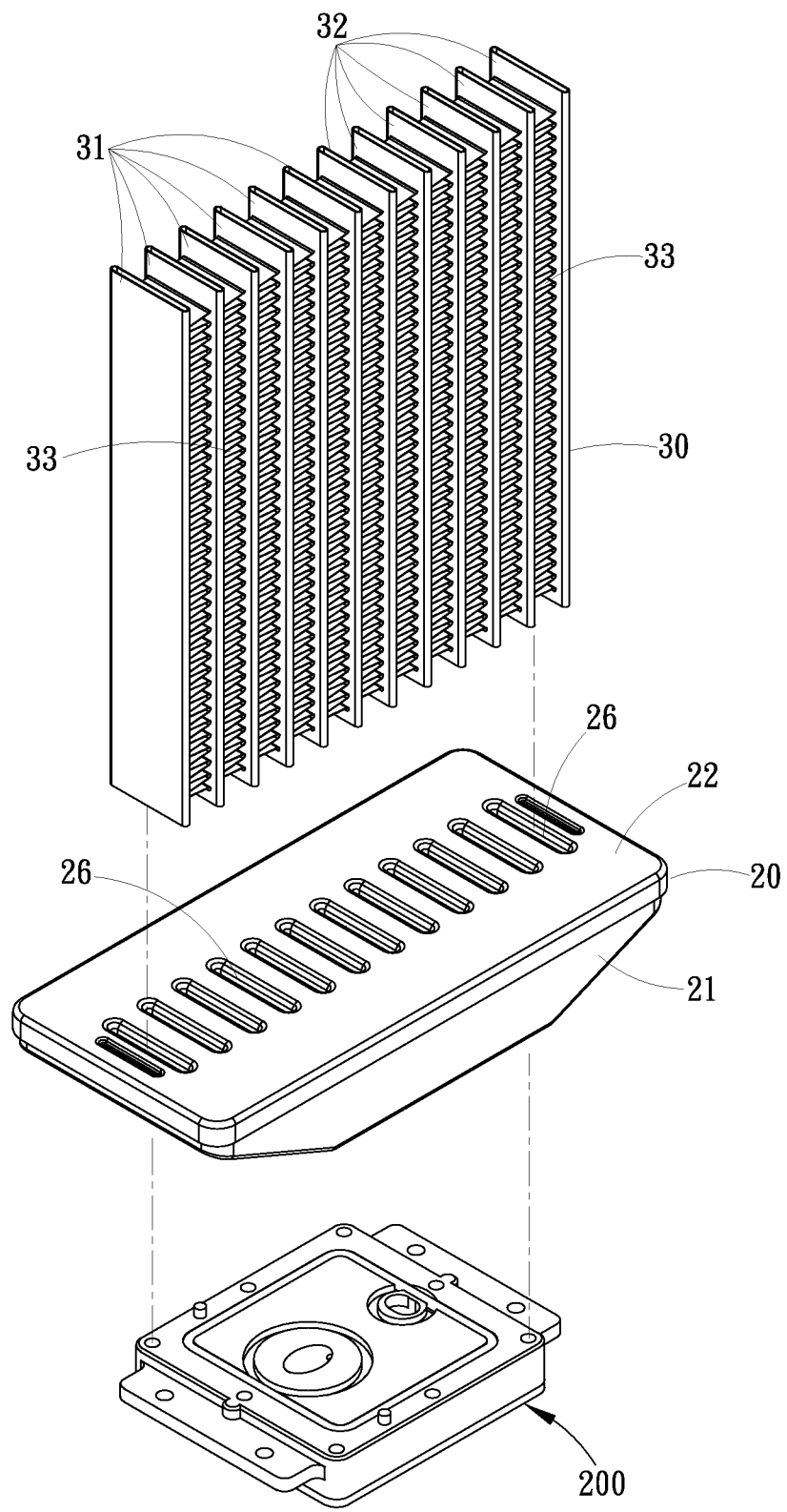
FIG. 6 is an exploded schematic diagram of the second liquid box and heat dissipation pipe set of the present invention.
Figure 7:
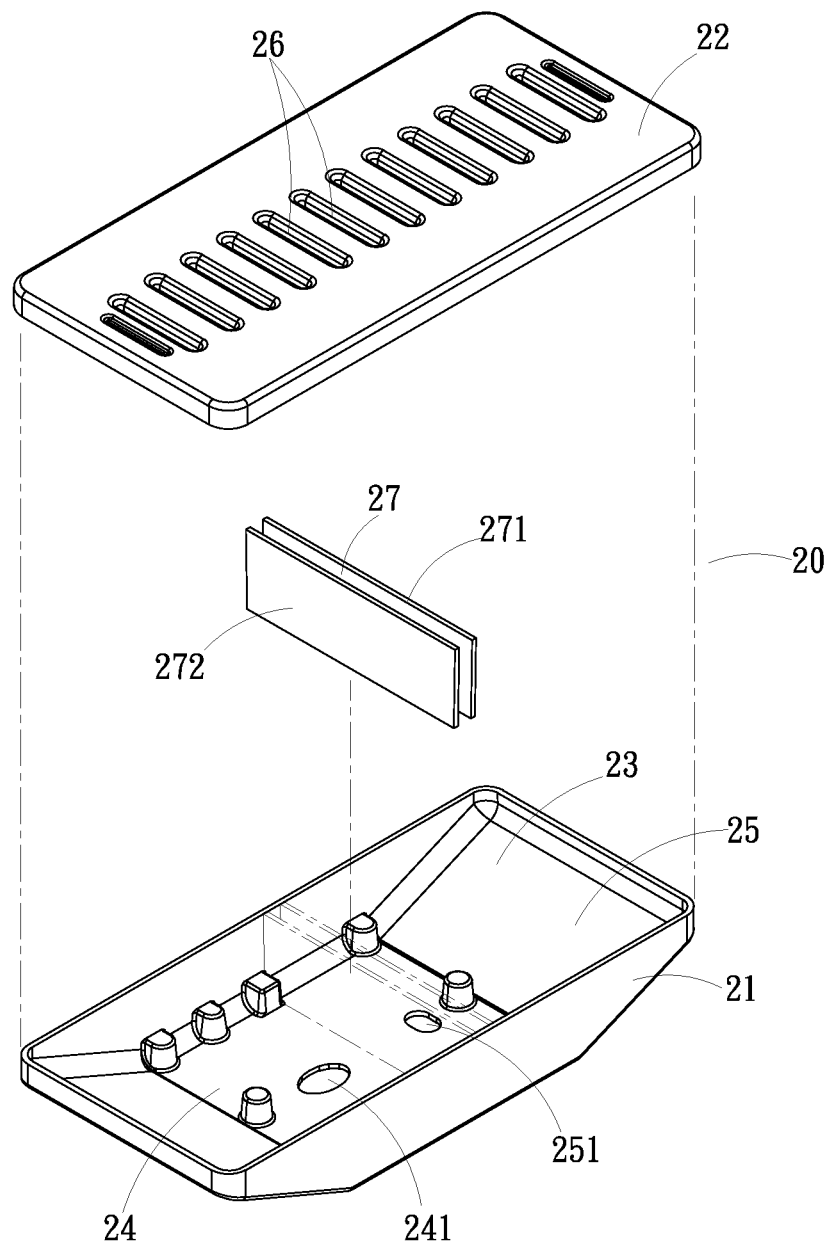
FIG. 7 is an exploded schematic diagram of the second liquid box of the present invention.

Referring to FIGS. 6, 7, and 8, the preferred implementation of the second liquid box 20 below the liquid cooling radiator 100 has a second box body 21 and a second box cover 22. The upper end of the second box body 21 is recessed to form a second chamber 23. The second chamber 23 is divided into a cold liquid chamber 24 and a hot liquid chamber 25. The bottom wall of the second box body 21 is combined with the above liquid cooling head 200. The cold liquid chamber 24 and the hot liquid chamber 25 are respectively connected to the liquid cooling head 200. The second box cover 22 covers the upper end of the second box body 21 to close the second chamber 23. The top wall of the second box cover 22 is provided with a plurality of second pipe jacks 26 connected to the cold liquid chamber 24 and the hot liquid chamber 25. The lower ends of the above-mentioned first pipes 31 and the second pipes 32 are respectively inserted into the second pipe jacks 26 (as shown in FIG. 8), so that the lower ends of the first pipes 31 are connected to the cold liquid chamber 24, and the lower ends of the second pipes 32 are connected to the hot liquid chamber 25.

Figure 10:
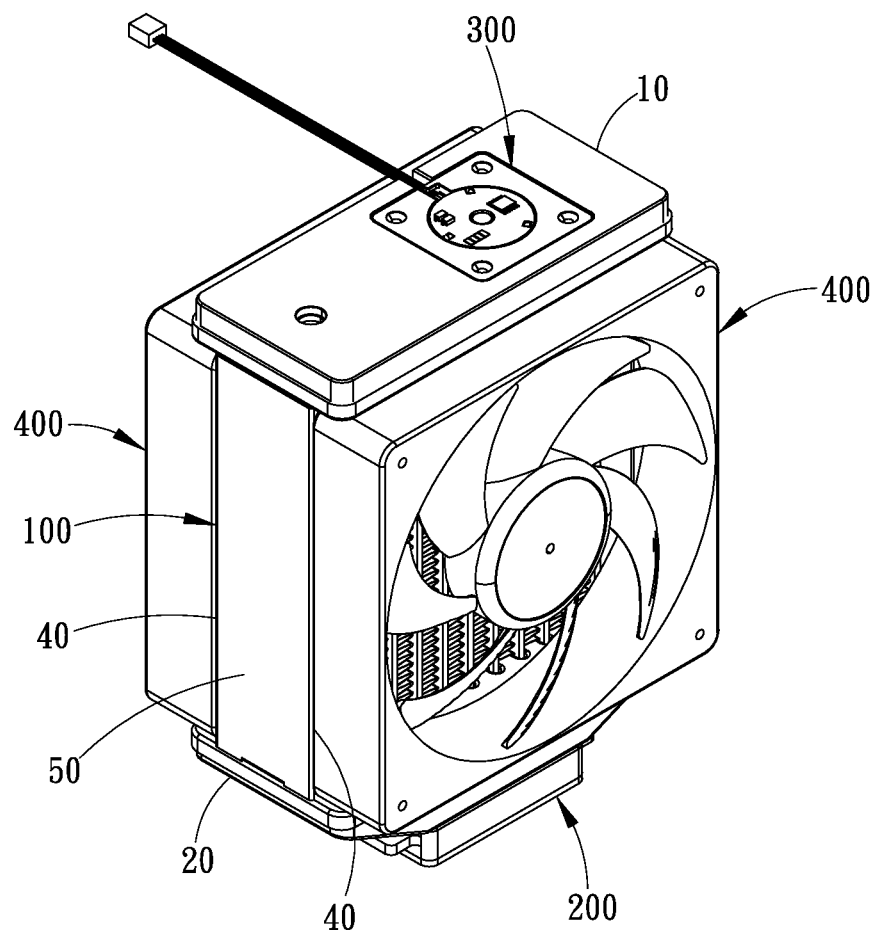
FIG. 10 is a schematic diagram of adding fans to the integrated liquid cooling heat dissipation device of the present invention.
Figure 11:
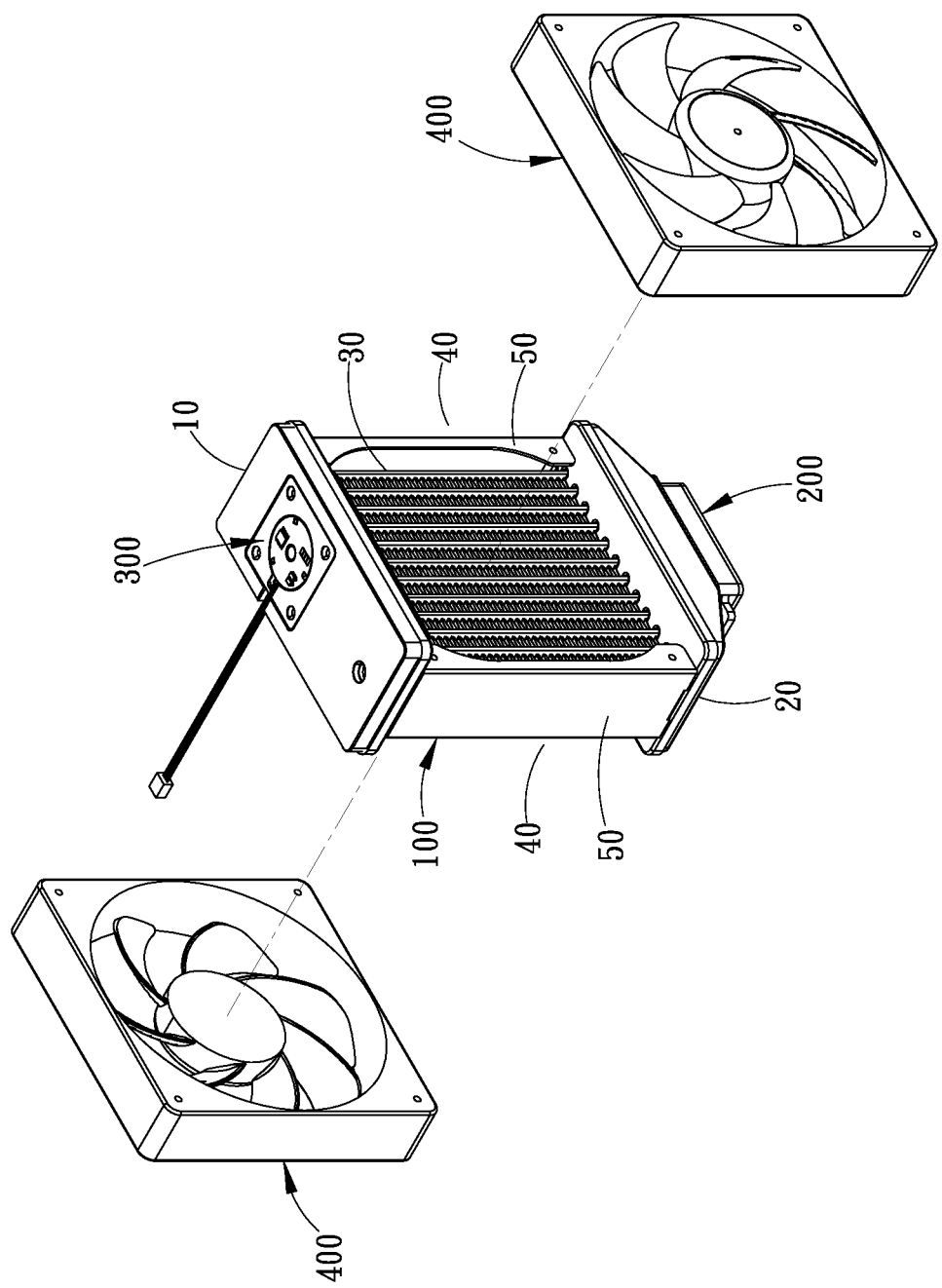
FIG. 11 is an exploded view of the fans installed in the integrated liquid cooling heat dissipation device of the present invention.

Through the structural design of the upper box body part 111 and the lower box body part 112 of the first liquid box 10, the present invention enables the first liquid box 10 to be implemented with a structure in which the upper box body part 111 is smaller in height, and the lower box body part 112 protrudes downward from the bottom of the upper box body part 111, so that only the upper box body part 111 with a smaller height is left on the heat dissipation pipe set 30 (and the fans described below) in the space where the lower box body part 112 extends downward to the heat dissipation pipe set 30. Therefore, the height volume of the liquid cooling radiator 100 can be reduced so that it can be installed and applied in a smaller computer case. As shown in FIG. 9, the front and rear ends of the upper box body part 111 of the first liquid box 10 and the front and rear ends of the second liquid box 20 protrude from the front and back of the heat dissipation pipe set 30 respectively, so that the liquid cooling radiator 100 can accommodate more working fluid (water, etc.) without increasing the height of the liquid cooling radiator 100, and a concave fan installation space 40 can be formed at the front and back of the liquid cooling radiator 100 respectively for accommodating a fan 400 respectively (as shown in FIG. 10 and FIG. 11).

Referring again to FIG. 4, FIG. 5 and FIG. 8, the inner surface of the first box cover 12 of the above-mentioned first liquid box 10 has a liquid pump seat 121 protruding into the first box body 11. The liquid pump seat 121 is cylindrical. The outside of the first box cover 12 is recessed with a liquid pump cavity 122 extending to the liquid pump seat 121. In this way, the liquid pump 300 is loaded into the liquid pump cavity 122 from the outside of the first box cover 12. The end face of the liquid pump seat 121 is provided with a liquid inlet hole 123 connected to the liquid pump cavity 122 and the liquid inlet chamber 116. One side of the liquid pump seat 121 is provided with a protrusion 124, and the protrusion 124 is also provided with a liquid outlet hole 125 connecting the liquid pump cavity 122 and the liquid outlet chamber 117. The above-mentioned first partition 13 is implemented as a T-shaped plate, and its top edge is provided with a gap 131 corresponding to the contour of the protrusion 124. The gap 131 is in close contact with the peripheral surface of the protrusion 124, and the other edges of the first partition 13 are in close contact with the inner walls of the first upper chamber 113 and the first lower chamber 114. When the liquid pump 300 is in operation, the working fluid of the liquid inlet chamber 116 can be sucked from the liquid inlet hole 123, and then transported from the liquid outlet hole 125 to the liquid outlet chamber 117, so that the working fluid circulates continuously in the liquid cooling radiator 100, and the circulating flow will pass through the liquid cooling head 200 to cool the processor chip, and then dissipate heat through the heat dissipation pipe set 30.

Referring again to FIG. 4, FIG. 5 and FIG. 8, in order to increase the structural strength of the first liquid box 10, the bottom wall of the upper box body part 111 of the first box body 11 is provided with a plurality of first ribs 118 protruding to the first upper chamber 113, and the top wall of the first box cover 12 is provided with a plurality of second ribs 126 protruding to the first upper chamber 113. Also, the top wall of the first box cover 12 is provided with a liquid injection hole 127 connected to the first upper chamber 113, and a detachable sealing element 128 (such as a sealing screw, etc.) is combined in the liquid injection hole 127.

Referring to FIG. 7 and FIG. 8, in order to prevent the heat transfer of the hot working fluid flowing into the hot liquid chamber 25 of the second box body 21 through the liquid cooling head 200 to the adjacent cold liquid chamber 24, in the present invention, an air heat insulation space 27 is set in the second chamber 23 of the second box body 21. The air heat insulation space 27 is composed of a hot liquid partition 271 and a cold liquid partition 272 arranged in the second chamber 23 and separated by a distance. The second chamber 23 is separated into the cold liquid chamber 24 and the hot liquid chamber 25 by the air heat insulation space 27. The lower box wall of the cold liquid chamber 24 is provided with a cold liquid inlet 241 for the cold working fluid to flow from the cold liquid chamber 24 to the liquid cooling head 200. The lower box wall of the hot liquid chamber 25 is provided with a hot liquid outlet 251 for returning the hot working fluid from the liquid cooling head 200 to the hot liquid chamber 25. Wherein, the second box body 21 is preferably implemented as a quadrilateral pyramid with a wider upper end and a narrower lower end, and the second chamber 23 is a conical chamber corresponding to the quadrilateral pyramid.

Referring again to FIG. 10 and FIG. 11, the preferred embodiment of the liquid cooling radiator 100 of the present invention further comprises two fan brackets 50. The two fan brackets 50 are combined on both sides of the heat dissipation pipe set 30, so that one or two fans 400 can be placed in the fan installation space 40 at the front and back of the liquid cooling radiator 100, and the fans 400 can be respectively fixed in the two fan brackets 50. When the fans 400 are running to send out air, it can not only blow to the heat dissipation pipe set 30, but also blow to the lower box body part 112 that protrudes downward to the heat dissipation pipe set 30, so as to improve the heat dissipation efficiency of the present invention.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. An integrated liquid cooling heat dissipation device comprising a liquid cooling radiator, a liquid cooling head and a liquid pump, said liquid cooling radiator comprising a first liquid box, a second liquid box and a heat dissipation pipe set, said heat dissipation pipe set comprising a plurality of first pipes, a plurality of second pipes and a plurality of cooling fins, said first pipes and second pipes being flat metal pipes with respective two opposite ends thereof respectively combined with said first liquid box and said second liquid box, said cooling fins being respectively set outside each of said first pipes and second pipes, said liquid cooling head having one side thereof combined outside a bottom wall of said second liquid box, said liquid pump being set in said first liquid box, wherein:

said first liquid box comprises a first box body, a first box cover and a first partition, said first box body being integrally formed into an upper box body part and a lower box body part, said upper box body part having a thickness and a width greater than that of said lower box body part, said upper box body part having an upper end thereof recessed into a first upper chamber, said lower box body part protruding downward beyond a lower end of said upper box body part, said first upper chamber having bottom surface thereof forming a first lower chamber and recessed into said lower box body part, said lower box body part having a bottom wall thereof provided with a plurality of first pipe jacks connected to said first lower chamber, said first box cover covering the upper end of said upper box body part, said first partition being set in said first upper chamber and said first lower chamber to divide said first upper chamber and said first lower chamber into a liquid inlet chamber and a liquid outlet chamber;

said second liquid box comprises a second box body and a second box cover, said second box body having an upper end thereof recessed into a second chamber, said second chamber being divided into a cold liquid chamber and a hot liquid chamber, said cold liquid chamber and said hot liquid chamber being respectively connected to said liquid cooling head, said second box cover covering the upper end of said second box body, said second box cover having a top wall thereof provided with a plurality of second pipe jacks connected to said cold liquid chamber and said hot liquid chamber, said first pipes and said second pipes have respective upper ends thereof respectively inserted into said first pipe jacks, and respective opposite lower ends thereof respectively inserted into said second pipe jacks;

said upper box body part of said first liquid box and said second liquid box have respective front and rear ends thereof protruding from opposing front and back of said heat dissipation pipe set respectively, so that a concave fan installation space is formed at the front and back of said liquid cooling radiator respectively.

2. The integrated liquid cooling heat dissipation device as claimed in claim 1, wherein said upper box body part and said lower box body part of said first box body form a T-shaped box body in side view; said first upper chamber and said first lower chamber form a T-shaped chamber in side view section.

3. The integrated liquid cooling heat dissipation device as claimed in claim 2, wherein said first box cover comprises a liquid pump seat located on an inner surface thereof and protruding into said first box body; said first box cover has an outside wall thereof recessed with a liquid pump cavity extending to said liquid pump seat, and said liquid pump is loaded into said liquid pump cavity from the outside of said first box cover.

4. The integrated liquid cooling heat dissipation device as claimed in claim 3, wherein said liquid pump seat comprises a liquid inlet hole located on an end face thereof and connected to said liquid pump cavity and said liquid inlet chamber, and a protrusion located on a side wall thereof and connected to said liquid pump cavity and said liquid outlet chamber said protrusion being provided with a liquid outlet hole connecting said liquid pump cavity and said liquid outlet chamber; said first partition is provided with a gap corresponding to the contour of said protrusion and closely connected to the surrounding surface of said protrusion.

5. The integrated liquid cooling heat dissipation device as claimed in claim 4, wherein said upper box body part comprises at least one first rib located on a bottom wall thereof and protruding to said first upper chamber; said first box cover comprises at least one second rib located on a top wall thereof and protruding to said first upper chamber.

6. The integrated liquid cooling heat dissipation device as claimed in claim 1, wherein said first box cover comprises a liquid injection hole located on a top wall thereof and connected to said first upper chamber, and a sealing element detachably set in said liquid injection hole.

7. The integrated liquid cooling heat dissipation device as claimed in claim 1, wherein said second box body comprises an air heat insulation space set in said second chamber, said air heat insulation space being composed of a hot liquid partition and a cold liquid partition set in said second chamber and separated by a distance, said air heat insulation space dividing said second chamber into said cold liquid chamber and said hot liquid chamber, said cold liquid chamber having a lower box wall thereof provided with a cold liquid inlet for a working fluid to flow from said cold liquid chamber to said liquid cooling head, said hot liquid chamber having a lower box wall thereof provided with a hot liquid outlet for said working fluid to flow from said liquid cooling head back to said hot liquid chamber.

8. The integrated liquid cooling heat dissipation device as claimed in claim 7, wherein said second box body is a quadrilateral pyramid with a wider upper end and a narrower lower end in a front thereof; said second chamber is a conical chamber corresponding to said quadrilateral pyramid.

9. The integrated liquid cooling heat dissipation device as claimed in claim 1, further comprising two fan brackets respectively combined on two opposite sides of said heat dissipation pipe sets.

10. The integrated liquid cooling heat dissipation device as claimed in claim 9, further comprising at least one fan placed in said fan installation space and fixed on said two fan brackets.

\* \* \* \* \*